(12) United States Patent
Ren et al.

(10) Patent No.: US 12,002,705 B2
(45) Date of Patent: Jun. 4, 2024

(54) METHODS AND APPARATUS FOR FORMING BACKSIDE POWER RAILS (71) Applicant: Applied Materials, Inc., Santa Clara, CA (US)

(72) Inventors: He Ren, San Jose, CA (US); Houssam Lazkani, Ballston Spa, NY (US); Raman Gaire, Mechanicville, NY (US); Mehul Naik, San Jose, CA (US); Kuan-Ting Liu, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 49 days.

(21) Appl. No.: 17/670,777

(22) Filed: Feb. 14, 2022

(65) Prior Publication Data
US 2023/0260825 A1  Aug. 17, 2023

(51) Int. Cl.
*H01L 21/74* (2006.01)
*H01L 21/02* (2006.01)
(Continued)

(52) U.S. Cl.
CPC ...... *H01L 21/743* (2013.01); *H01L 21/02016* (2013.01); *H01L 21/02365* (2013.01); *H01L 23/5286* (2013.01); *H01L 23/535* (2013.01)

(58) Field of Classification Search
CPC ............ H01L 21/743; H01L 21/02016; H01L 21/02293; H01L 21/02631; H01L 21/02634; H01L 21/2018; H01L 21/2022–2026; H01L 21/2033–2036; H01L 21/2085; H01L 21/2855; H01L 21/3147; H01L 21/76248; H01L 21/76262; H01L 21/76278; H01L 21/76294; H01L 21/76297; H01L 21/76814; H01L 21/76819; H01L 21/76823–76828; H01L 21/7684; H01L 21/76853–76865; H01L 21/30604–30621; H01L 21/3063–30635;
(Continued)

(56) References Cited

U.S. PATENT DOCUMENTS 10,586,765 B2   3/2020   Smith et al.
10,636,739 B2   4/2020   Beyne et al.
(Continued)

OTHER PUBLICATIONS

International Search Report and Written Opinion for PCT/US2023/012883 dated Jun. 12, 2023.

*Primary Examiner* — Jonathan Han
(74) *Attorney, Agent, or Firm* — MOSER TABOADA (57) ABSTRACT

A method that forms a sacrificial fill material that can be selectively removed for forming a backside contact via for a transistor backside power rail. In some embodiments, the method may include performing an etching process on a substrate with an opening that is conformally coated with an oxide layer, wherein the etching process is an anisotropic dry etch process using a chlorine gas to remove the oxide layer from a field of the substrate and only from a bottom portion of the opening, and wherein the etching process forms a partial oxide spacer in the opening and increases a depth of the opening and epitaxially growing the sacrificial fill material in the opening by flowing a hydrogen chloride gas at a rate of approximately 60 sccm to approximately 90 sccm in a chamber pressure of approximately 1 Torr to approximately 100 Torr.

20 Claims, 5 Drawing Sheets

(51) Int. Cl.
*H01L 23/528* (2006.01)
*H01L 23/535* (2006.01)

(58) Field of Classification Search
CPC .......................... H01L 21/3065–30655; H01L 21/31055–31056; H01L 21/31111–31122; H01L 21/31133–31138; H01L 21/32133–32139; H01L 21/465; H01L 21/30625; H01L 21/31051; H01L 21/3212–32125; H01L 21/0272; H01L 21/0331; H01L 21/7813; H01L 2224/0347–0348; H01L 2224/1147–1148; H01L 2224/2747–2748; H01L 21/0262; H01L 21/02271–0228; H01L 2021/60082; H01L 2224/80143; H01L 2224/81143; H01L 2224/82243; H01L 2224/84143; H01L 2224/85143; H01L 2224/86143; H01L 2224/95143; H01L 29/66606; H01L 29/66515; H01L 29/41725–41791; H01L 29/41775; H01L 29/41783; H01L 29/66575–66598; H01L 21/67718; H01L 21/02365; H01L 23/5286; H01L 23/535; H01L 21/02381; H01L 21/0243; H01L 21/02433; H01L 21/3086; H01L 21/76831; H01L 21/02639; H01L 21/76897; H01L 21/02019; H01L 2224/83143; H01L 21/76898; C30B 25/02–22; H10K 71/221; C23C 16/00–16/56; B28D 5/0005–0052; B81C 3/005; B81C 2203/052–057
See application file for complete search history.

(56) References Cited

U.S. PATENT DOCUMENTS

| | | |
|---|---|---|
| 2002/0185469 A1 | 12/2002 | Podlesnik et al. |
| 2009/0117705 A1 | 5/2009 | Oh |
| 2021/0134721 A1 | 5/2021 | Chiang et al. |
| 2021/0305381 A1 | 9/2021 | Chiang et al. |
| 2021/0375857 A1 | 12/2021 | Huang et al. |
| 2021/0408246 A1 | 12/2021 | Ganguly et al. |
| 2021/0408249 A1* | 12/2021 | Yu ..................... H01L 29/66545 |
| 2022/0033197 A1* | 2/2022 | Phan ................. H01L 21/68707 |
| 2022/0359682 A1* | 11/2022 | Lee ................... H01L 29/41791 |
| 2023/0048829 A1* | 2/2023 | Lee ................... H01L 29/78696 |
| 2023/0074752 A1* | 3/2023 | Huang .............. H01L 21/76885 |
| 2023/0095007 A1* | 3/2023 | Mehandru ......... H01L 29/42392 |
| | | 257/288 |

* cited by examiner

METHODS AND APPARATUS FOR FORMING BACKSIDE POWER RAILS

FIELD

Embodiments of the present principles generally relate to semiconductor processing of semiconductor substrates.

BACKGROUND

Transistors used in logic and memory require a power source to operate. The power is typically supplied by a power rail which connects each transistor to the power source. Architectures that include a front side power grid have the power rail intermixed with signal lines used by the transistors, creating a complex network and delicate balance between the interleaved power rails and signal lines. Traditional backside power sources may utilize vias that extend into the transistors, making the transistor area larger. Similarly, buried power rails that connect to the transistors also increase the area used by the transistors.

Accordingly, the inventors have provided improved methods and apparatus for forming power distribution rails that supply power to the transistors without requiring an increase in transistor area, simplifying the transistor architecture and formation processes while increasing transistor density.

SUMMARY

Methods and apparatus for forming backside power supply structures are provided herein.

In some embodiments, a method for forming a sacrificial fill material may comprise performing an etching process on a substrate with an opening that is conformally coated with an oxide layer, wherein the etching process is an anisotropic dry etch process using a chlorine gas that removes the oxide layer from a field of the substrate and only from a bottom portion of the opening, and wherein the etching process forms a partial oxide spacer in the opening and increases a depth of the opening and epitaxially growing the sacrificial fill material in the opening by flowing a hydrogen chloride gas at a rate of approximately 60 sccm to approximately 90 sccm in a chamber pressure of approximately 1 Torr to approximately 100 Torr.

In some embodiments, the method may further include wherein the sacrificial fill material is silicon, silicon germanium, silicon oxide, silicon nitride, silicon carbide, aluminum oxide, or hafnium oxide, wherein the silicon or the silicon germanium contains a dopant of boron, phosphorous, carbon, oxygen, or antimony, wherein the sacrificial fill material is $SiGe_{0.4}$, epitaxially growing the sacrificial fill material using a selective epitaxial growth process with a selectivity of <100> crystal plane silicon material over <110> crystal plane silicon material, wherein the selectivity of <100> crystal plane silicon material over <110> crystal plane silicon material is approximately 4:1 and greater, performing the method in an integrated cluster tool without an air break or intermediate wet preclean process, wherein the rate of the hydrogen chloride gas is approximately 70 sccm, performing the method in a process to form a backside power via for a transistor structure, and/or forming a self-aligned epitaxial source/drain structure of a transistor on the sacrificial fill material.

In some embodiments, a method of forming a backside power rail contact for a source/drain epitaxial (Epi) structure of a transistor may comprise forming an opening in a substrate, depositing a conformal layer of oxide on the substrate and in the opening, performing an etching process on the substrate and the opening, wherein the etching process is an anisotropic dry etch process using a chlorine gas that removes the conformal layer of oxide from a field of the substrate and only from a bottom portion of the opening, and wherein the etching process forms a partial oxide spacer in the opening and increases a depth of the opening, epitaxially growing a sacrificial fill material in the opening by flowing a hydrogen chloride gas at a rate of approximately 60 sccm to approximately 90 sccm in a chamber pressure of approximately 1 Torr to approximately 100 Torr, forming a source/drain Epi structure on the sacrificial fill material, forming a gate material on the source/drain Epi structure, forming at least one interconnect signal lines above the gate material, flipping the substrate to reveal a backside of the substrate, removing material of the substrate to expose the sacrificial fill material, selectively etching the sacrificial fill material to remove the sacrificial fill material, and forming the backside power rail contact which is self-aligned to the source/drain Epi structure.

In some embodiments, the method may further include wherein the sacrificial fill material is silicon germanium (SiGe), epitaxially growing the sacrificial fill material using a selective epitaxial growth process with a selectivity of <100> crystal plane silicon material over <110> crystal plane silicon material, wherein the selectivity of <100> crystal plane silicon material over <110> crystal plane silicon material is approximately 4:1 and greater, wherein the conformal layer of oxide is an aluminum oxide material, and/or wherein the rate of the hydrogen chloride gas is approximately 70 sccm.

In some embodiments, a non-transitory, computer readable medium having instructions stored thereon that, when executed, cause a method for forming a sacrificial fill material to be performed, the method may comprise performing an etching process on a substrate with an opening that is conformally coated with an oxide layer, wherein the etching process is an anisotropic dry etch process using a chlorine gas that removes the oxide layer from a field of the substrate and only from a bottom portion of the opening, and wherein the etching process forms a partial oxide spacer in the opening and increases a depth of the opening and epitaxially growing the sacrificial fill material in the opening by flowing a hydrogen chloride gas at a rate of approximately 60 sccm to approximately 90 sccm in a chamber pressure of approximately 1 Torr to approximately 100 Torr.

In some embodiments, the method on the non-transitory, computer readable medium may further include epitaxially growing the sacrificial fill material using a selective epitaxial growth process with a selectivity of <100> crystal plane silicon material over <110> crystal plane silicon material and wherein the selectivity of <100> crystal plane silicon material over <110> crystal plane silicon material is approximately 4:1 and greater, wherein the rate of the hydrogen chloride gas is approximately 70 sccm, wherein the method is performed in an integrated cluster tool without an air break or intermediate wet preclean process, or wherein the method is performed in a process to form a backside power via for a transistor structure, and/or forming a self-aligned epitaxial source/drain structure of a transistor on the sacrificial fill material.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The methods and apparatus provide high-density transistor structures with simplified formation processes. Backside power rail architecture integration and unit processes leverage selective bottom-up sacrificial fill to form the high-density transistor structures. The techniques co-optimize incoming etch and clean process sequences along with an epitaxial growth process. In some embodiments, the sacrificial fill material may be silicon or silicon germanium with or without dopants such as, but not limited to, boron, phosphorous, carbon, oxygen, antimony, etc. In some embodiments, the sacrificial fill material may be a dielectric such as, but not limited to, silicon oxide, silicon nitride, silicon carbide, aluminum oxide, or hafnium oxide and the like. The present principles have the advantages of preventing pinch-off voids due to undesirable growth from a structure's sidewall by using a bottom-up fill process and also preventing selectivity loss that induces nodule defects at the structure's surface and sidewall by using a selective fill process.

Backside power rail (BPR) based architectures are newer processes that are being considered for advanced nodes in the near future and beyond. The present principles can be utilized to enable a front-to-back type connectivity by using a sacrificial fill at the wafer frontside. The sacrificial fill can then be replaced at the wafer backside in a self-aligned power via formation process. The present principles further enable the processes by providing a selective bottom-up fill process for the sacrificial fill. Additional advantages of the techniques include an etch process that eliminates the need for a post-etch wet clean process. The etch process preserves any oxide (e.g., $AlO_x$) inner spacers, avoiding sidewall kinks which can result in an undesirable pinch-off growth later during epitaxial (Epi) growth processes. Another advantage is a new Epi growth process that fills the structure without selectivity loss on surrounding dielectrics (e.g., SiN, $SiO_2$, $Al_2O_3$, etc.).

Figure 1:
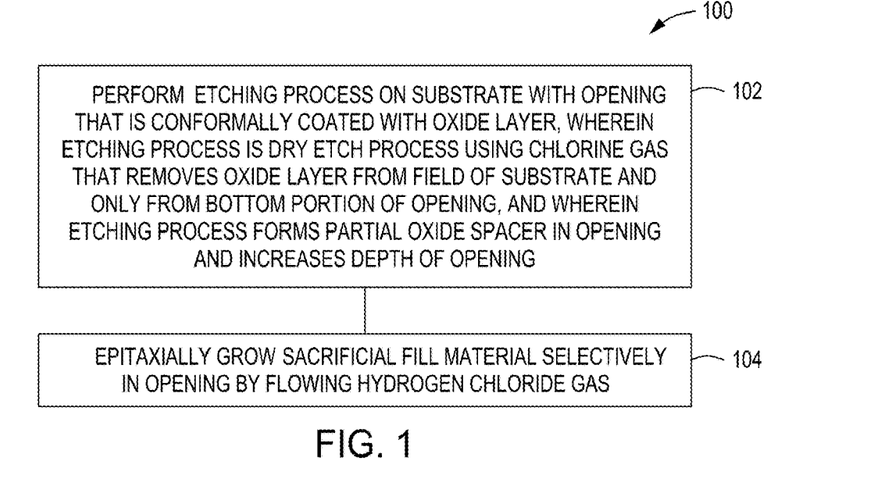
FIG. 1 is a method of forming a sacrificial fill material in a substrate in accordance with some embodiments of the present principles.
Figure 3:
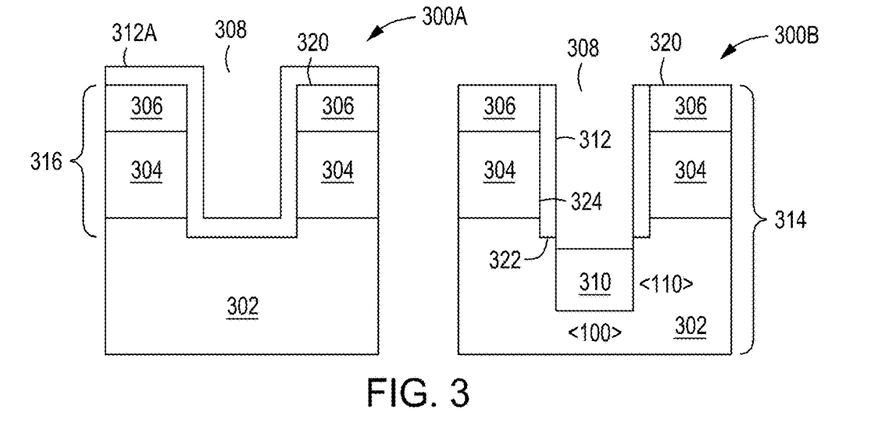
FIG. 3 depicts a cross-sectional view of an opening on a substrate undergoing etch and fill processes in accordance with some embodiments of the present principles.
Figure 4:
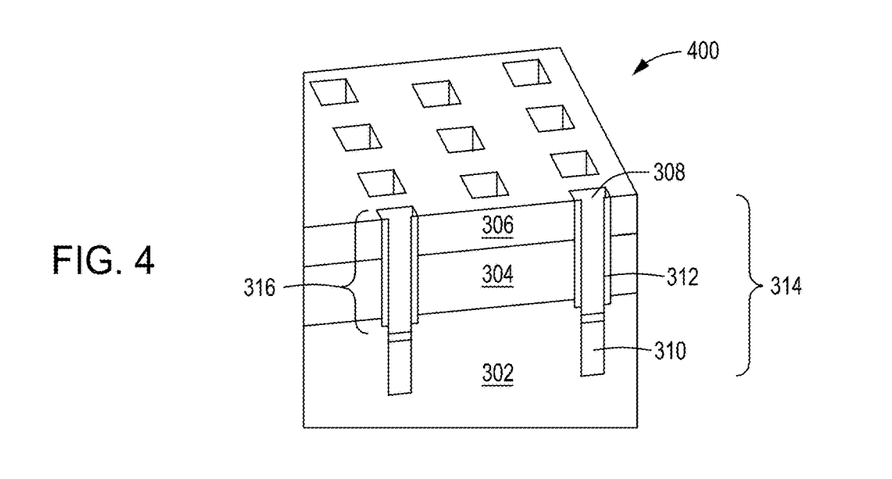
FIG. 4 depicts an isometric view of a substrate in preparation for forming transistor structures in accordance with some embodiments of the present principles.

FIG. 1 is a method 100 of forming a sacrificial fill material in a substrate 302 in accordance with some embodiments as depicted in FIGS. 3 and 4. The substrate 302 may be formed from a material such as, for example but not limited to, silicon and the like. Although in the examples the substrate 302 has been prepared to form a transistor, the techniques of the present principles may also be used to form sacrificial material for other uses as well. As such, the examples are not meant to be limiting as to the context of the formation of the sacrificial fill material and associated processes. In a view 300A of FIG. 3, the substrate 302 has been formed with a first dielectric layer 304 and a second dielectric layer 306. The first dielectric layer 304 may be formed from, for example but not limited to, silicon oxide and the like. The second dielectric layer 306 may be formed from, for example but not limited to, silicon nitride and the like. An oxide layer 312A has been conformally formed on the field 320 of the substrate 302 and in an opening 308 with a first depth 316. The oxide layer 312A may be formed from, for example but not limited to, aluminum oxide and the like. In block 102 of method 100, an etching process is performed on the substrate 302. The etching process is a dry etch process using a chlorine gas that is anisotropic and removes portions of the oxide layer from the field 320 of the substrate 302, and only a bottom portion of the oxide layer in the opening 308 as depicted in a view 300B of FIG. 3. The etching process also increases the depth of the opening 308 to a second depth 314 greater than the first depth 316.

After the etching process removes the oxide layer 312A from the field 320 of the substrate 302 and the bottom of the opening 308, a spacer 312 remains in a portion of the opening 308. In traditional approaches, portions of the oxide layer on the sidewalls 324 of the opening 308 are etched away from inside of the opening 308, leaving a ledge 322 that creates a pinch-off point and causes voids in the opening 308 when attempting to fill the opening 308. The methods of the present principles use an anisotropic etch that advantageously retains the spacer 312 on the sidewalls 324 of the opening 308, preventing the formation of any pinch-off points and preventing void formation during filling of the opening 308. The dry etch process of method 100 uses a chlorine gas etch process and, beneficially, removes the requirement for a wet preclean process in an integrated flow that is required by traditional processes using fluorine-based anisotropic etch processes. In some embodiments, the dry etch process is performed with a plasma source power of approximately 100 watts to approximately 3000 watts and with a bias source power of zero to approximately 500 watts. In some embodiments, the chlorine gas may be flowed at a rate of approximately 10 sccm to approximately 500 sccm. In some embodiments, the chlorine gas may be flowed with oxygen, argon, helium, or nitrogen gas and the like. In some embodiments, the chamber pressure for the dry etch process may be at approximately 1 m Torr to approximately 100 m Torr.

The use of a chlorine gas only based etching process prior to the fill provides a clean and proper surface at the bottom of the opening 308 for bottom-up Epi nucleation. In block 104, a sacrificial fill material is epitaxially grown in the opening 308 using a selective process based on flowing hydrogen chloride gas. The inventors discovered that by flowing a hydrogen chloride gas at a particular rate, selectivity of the epitaxial growth could be maintained while maintaining a fast growth rate. The bottom of the opening 308 exposes a <100> crystal plane of the substrate 302 while the sidewalls expose a <110> crystal plane. The hydrogen chloride gas rate can be adjusted to provide selectivity of the Epi growth on the <100> crystal plane (bottom of opening) while suppressing Epi growth on the <110> crystal plane (sidewalls). The inventors found that a hydrogen chloride gas rate at or above approximately 60 sccm 512 provided sufficient selectively for the Epi growth on the <100> crystal plane while a hydrogen chloride gas rate at or below 90 sccm 514 provided a sufficient deposition rate for the Epi growth as depicted in a graph 500 of FIG. 5.

Figure 5:
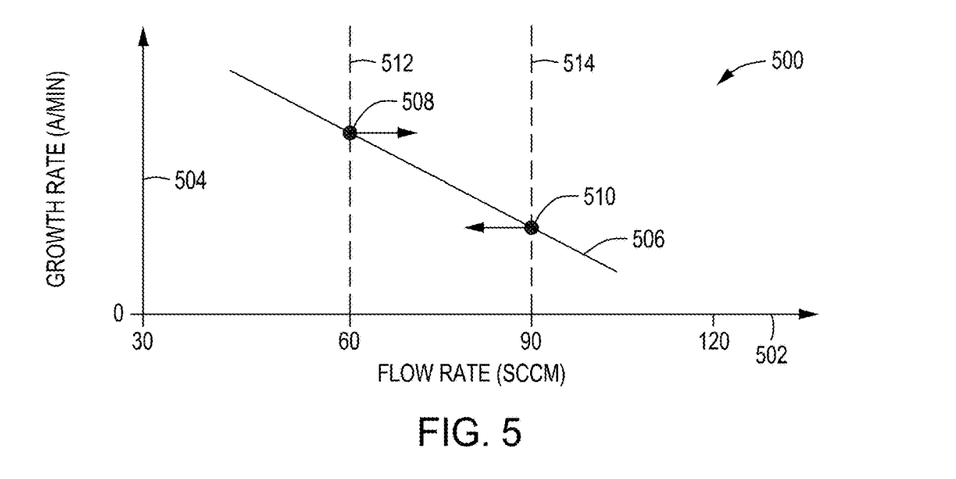
FIG. 5 depicts a graph of a flow rate versus a growth rate in accordance with some embodiments of the present principles.

The Epi growth rate (angstroms per minute) is shown on the Y-axis 504 and the hydrogen chloride gas flow rate (sccm) is shown on the X-axis 502. A recipe line 506 shows flow rate versus growth rate for a particular deposition recipe profile. At a first point 508, the selectivity was sufficient to keep Epi growth from occurring on the field or top surface of the substrate (growth on the bottom of the opening only). At a second point 510, the deposition rate was deemed sufficient for a desired yield in a particular structure formation process. The inventors also discovered that the selectivity ratio could be increased by lowering the pressure during Epi growth from a traditional pressure to a pressure of approximately 5 Torr. In some embodiments, the hydrogen chloride gas flow rate is approximately 70 sccm and the pressure is approximately 5 Torr to yield a selectivity ratio of approximately 4:1 or greater of <100> crystal plane Epi growth over <110> crystal plane Epi growth. In some embodiments, the chamber pressure during Epi growth may be approximately 1 Torr to approximately 100 Torr. In some embodiments, the chamber pressure during Epi growth may be approximately 1 Torr to approximately 40 Torr. In some embodiments, the chamber pressure during Epi growth may be approximately 3 Torr to approximately 20 Torr. The inventors also found that gases such as, for example, silane produced lower selectivity and higher pressures undesirably increased the Epi growth rate on the <110> crystal plane, also decreasing selectivity. In some embodiments, the etching process of block 102 and the sacrificial fill process of block 104 of the method 100 can be performed, for example, in an integrated tool 1000 of FIG. 10 which enables a wet free integrated process by eliminating exposure of the substrate 302 to an air break in between processes. By maintaining the substrate 302 in vacuum for the etch and fill processes, no oxide due to air exposure that needs to be removed is formed on the surfaces prior to Epi bottom-up filling.

In FIG. 3, the sacrificial fill material 310 provided by the Epi growth is depicted as a bottom-up fill. The amount of fill can be adjusted based on the context in which the method 100 is performed. In some embodiments, the oxide layer 312A and the spacer 312 may not be formed prior to the etching process of block 102 and the sacrificial material filling of block 104. FIG. 4 is an isometric view 400 of preparation for forming a bank of transistors. Openings have been formed in the substrate 302 through the second dielectric layer 306, the first dielectric layer 304, and into the substrate 302. The etching process of block 102 of method 100 has produced the spacer 312 in the opening 308 and the sacrificial fill process of block 104 of method 100 has produced the sacrificial fill material 310 at the bottom of the opening 308. Formation of the source/drain Epi structures on the sacrificial fill material 310 along with gate materials and interconnect lines are discussed below for transistor specific structures. The etching and formation of sacrificial fill material of the method 100 can be used for other structures that would benefit from sacrificial fill material for further backside processing of the structures.

Figure 2:
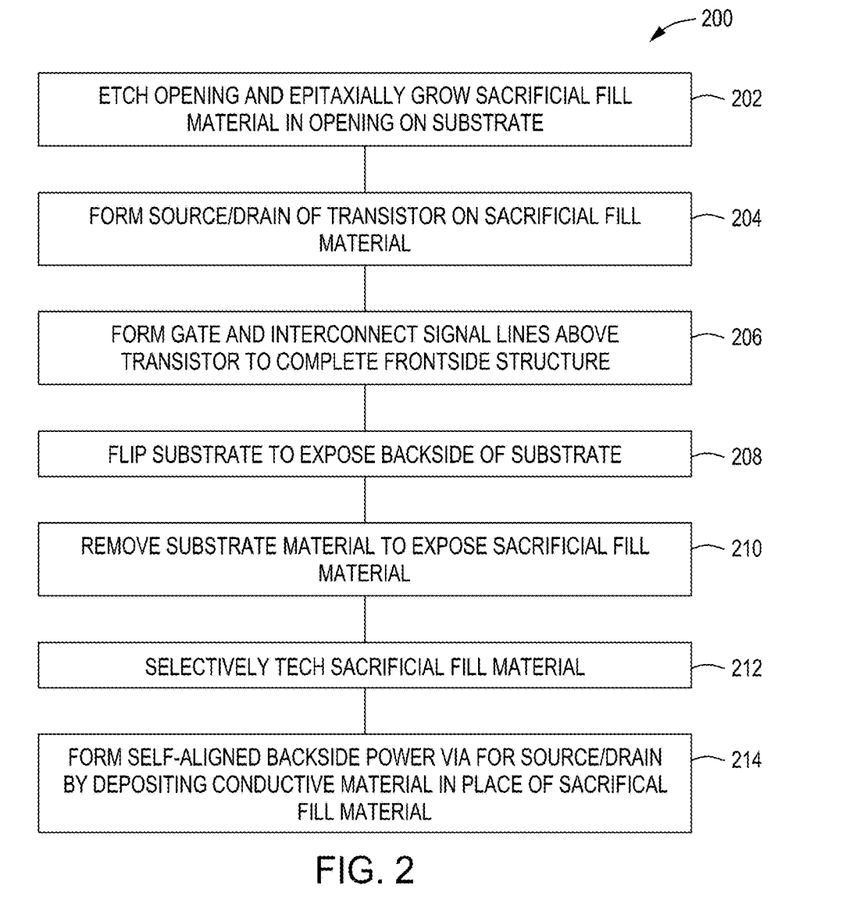
FIG. 2 is a method of forming a backside power rail contact in accordance with some embodiments of the present principles.
Figure 6:
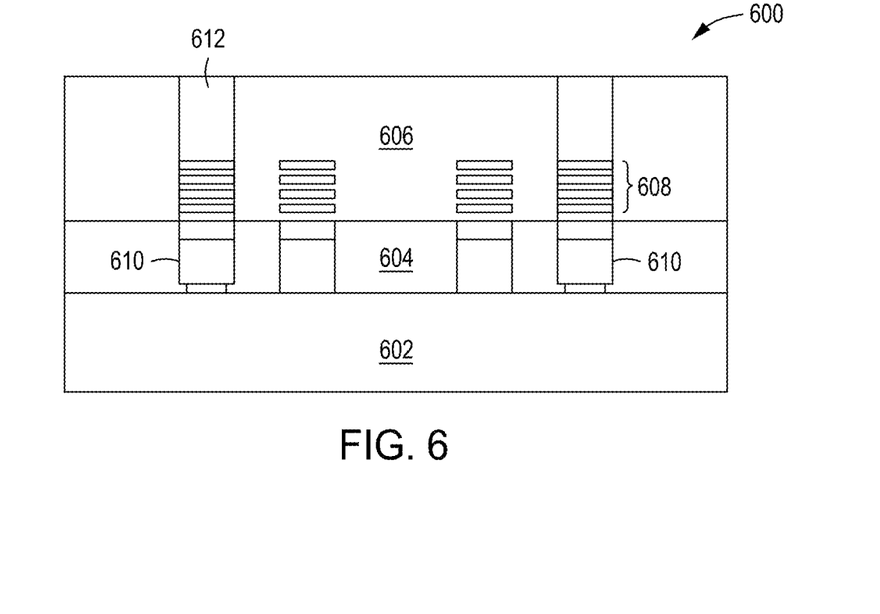
FIG. 6 depicts a cross-sectional view of sacrificial material fill formed in an opening for a transistor structure in accordance with some embodiments of the present principles.
Figure 7:
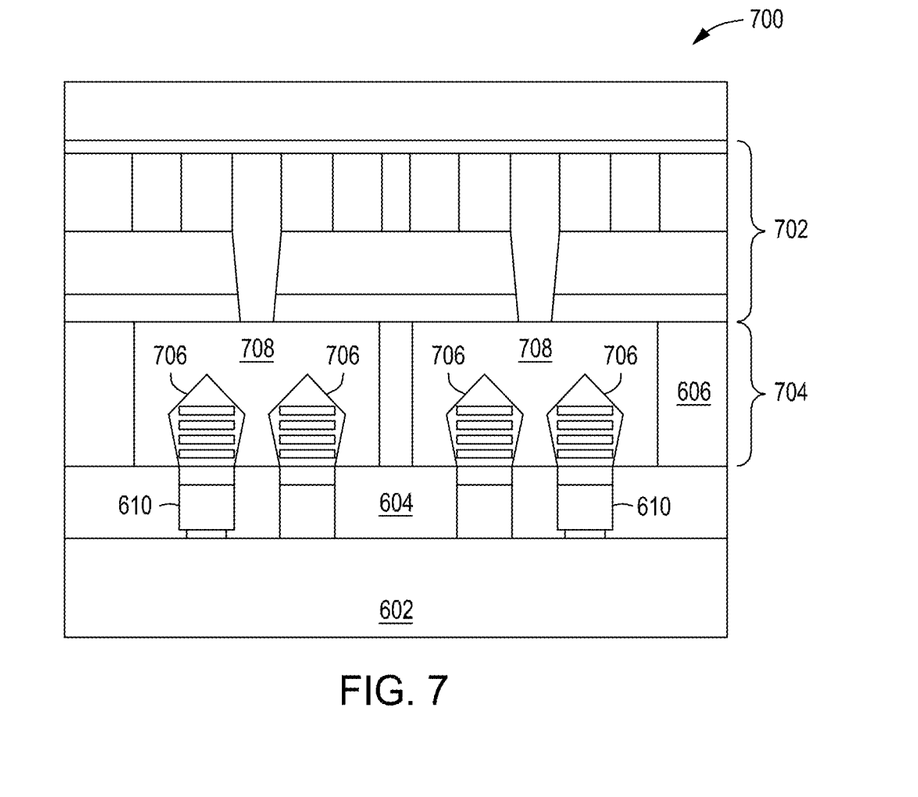
FIG. 7 depicts a cross-sectional view of a transistor structure with a sacrificial material fill in accordance with some embodiments of the present principles.
Figure 8:
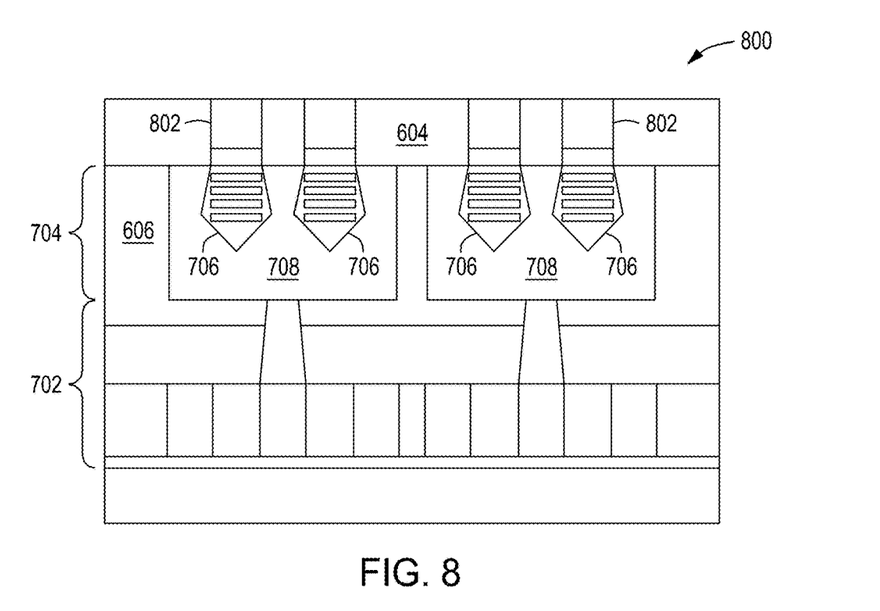
FIG. 8 depicts a cross-sectional view of a flipped substrate in accordance with some embodiments of the present principles.

In FIG. 2, a method 200 for forming a backside power rail contact for a transistor structure is depicted. In block 202, an opening is etched and a sacrificial fill material is epitaxially grown in the opening on a substrate. The etching of the opening is performed as described above for block 102 of method 100 and the sacrificial fill material is deposited as described above for block 104 of method 100. In a cross-sectional view 600 of FIG. 6, an opening 612 on a substrate 602 has been partially filled with a sacrificial fill material 610. The opening 612 goes through a first dielectric layer 604 and a second dielectric layer 606. Alternating layers 608 of an Epi structure have been formed above the sacrificial fill material 610. In block 204, a source/drain of the transistor is formed on the sacrificial fill material 610. In a cross-sectional view 700 of FIG. 7, Epi source/drain structures 706 are formed on the sacrificial fill material 610. In block 206, a gate 708 is formed on the Epi source/drain structures 706 and interconnect signal lines 702 are formed above the transistor to complete the frontside structure of the transistors 704 as depicted in cross-sectional view 700 of FIG. 7. In block 208, the substrate 602 is flipped to expose the backside of the substrate 602 upwards as depicted in a view 800 of FIG. 8. In block 210, the substrate material is removed to expose the sacrificial fill material. The substrate material may be removed by chemical mechanical polishing (CMP) and the like. In block 212, the sacrificial fill material is selectively etched to remove the sacrificial fill material. In block 214, a self-aligned backside power rail via or contact 802 for the Epi source/drain structures 706 is formed by depositing conductive material in place of the removed sacrificial fill material. The transistor structures 704 may undergo further processing such as additional layers of insulative materials on the backside along with other power vias and backside power rails and connections thereto.

Figure 9:
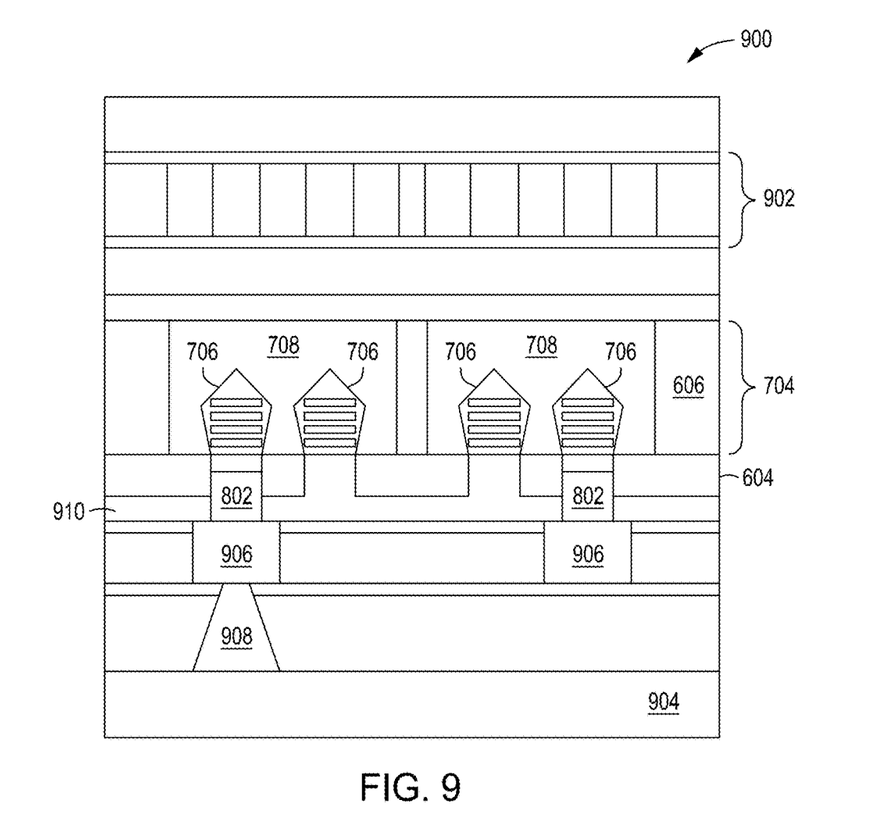
FIG. 9 depicts a cross-sectional view of a transistor structure in accordance with some embodiments of the present principles.

FIG. 9 is a cross-sectional view 900 of a transistor structure 704 depicted with a backside power rail 904 and a backside isolation layer 910. The backside power rail 904 is electrically connected through several redistribution layers (RDLs) 906 and vias 908 to the backside power rail or contact 802 of the Epi source/drain structures 706 of the transistor structure 704. The backside power rail or contact 802 is self-aligned to the Epi source/drain structures 706 and are positioned directly beneath the Epi source/drain structures 706 enabling a substantial reduction in transistor area on a substrate. The reduced area needed for the transistor structures 704 allows substantially higher transistor densities to be achieved. In addition, the removal of power rails above the transistor structures 704 allow for unimpeded interconnect signal lines 902, eliminating possible crosstalk and noise from the power lines. The removal of the power rails from above the transistor structures 704 also advantageously permits increased interconnect signal line densities.

Figure 10:
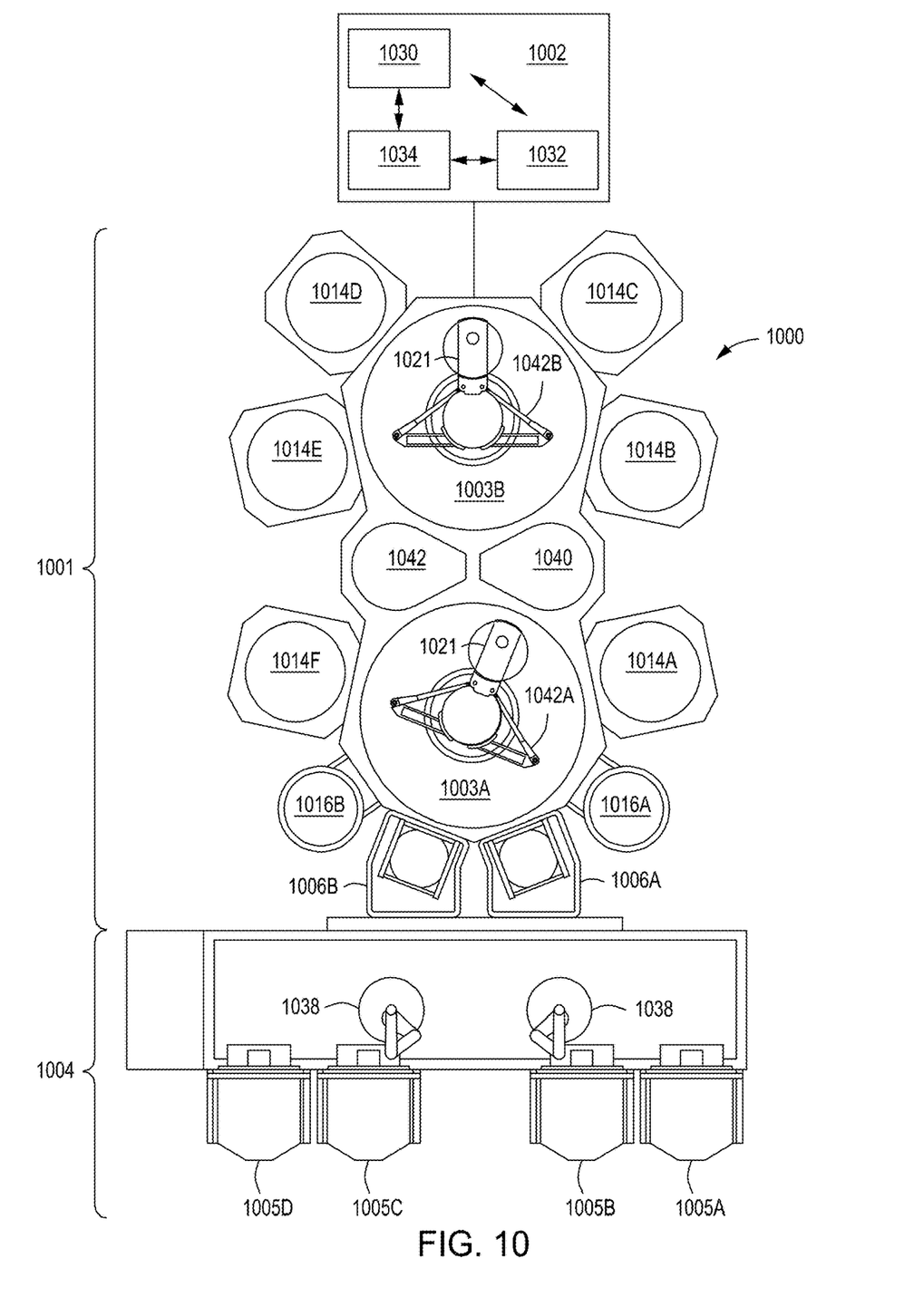
FIG. 10 depicts a top-down view of an integrated tool in accordance with some embodiments of the present principles.

The methods described herein may be performed in individual process chambers that may be provided in a standalone configuration or as part of a cluster tool, for example, an integrated tool 1000 (i.e., cluster tool) described below with respect to FIG. 10. The advantage of using an integrated tool 1000 is that there is no vacuum break and, therefore, no requirement to degas and pre-clean a substrate before treatment in an epitaxial growth chamber after an etching process. The integrated tool 1000 includes a vacuum-tight processing platform 1001, a factory interface 1004, and a system controller 1002. The processing platform 1001 comprises multiple processing chambers, such as 1014A, 1014B, 1014C, 1014D, 1014E, and 1014F operatively coupled to a vacuum substrate transfer chamber (transfer chambers 1003A, 1003B). The factory interface 1004 is operatively coupled to the transfer chamber 1003A by one or more load lock chambers (two load lock chambers, such as 1006A and 1006B shown in FIG. 10).

In some embodiments, the factory interface 1004 comprises at least one docking station 1007, at least one factory interface robot 1038 to facilitate the transfer of the semiconductor substrates. The docking station 1007 is configured to accept one or more front opening unified pod (FOUP). Four FOUPS, such as 1005A, 1005B, 1005C, and 1005D are shown in the embodiment of FIG. 10. The factory interface robot 1038 is configured to transfer the substrates from the factory interface 1004 to the processing platform 1001 through the load lock chambers, such as 1006A and 1006B. Each of the load lock chambers 1006A and 1006B have a first port coupled to the factory interface 1004 and a second port coupled to the transfer chamber 1003A. The load lock chamber 1006A and 1006B are coupled to a pressure control system (not shown) which pumps down and vents the load lock chambers 1006A and 1006B to facilitate passing the substrates between the vacuum environment of the transfer chamber 1003A and the substantially ambient (e.g., atmospheric) environment of the factory interface 1004. The transfer chambers 1003A, 1003B have vacuum robots 1042A, 1042B disposed in the respective transfer chambers 1003A, 1003B. The vacuum robot 1042A is capable of transferring substrates 1021 between the load lock chamber 1006A, 1006B, the processing chambers 1014A and 1014F and a cooldown station 1040 or a pre-clean station 1042. The vacuum robot 1042B is capable of transferring substrates 1021 between the cooldown station 1040 or pre-clean station 1042 and the processing chambers 1014B, 1014C, 1014D, and 1014E.

In some embodiments, the processing chambers 1014A, 1014B, 1014C, 1014D, 1014E, and 1014F are coupled to the transfer chambers 1003A, 1003B. The processing chambers 1014A, 1014B, 1014C, 1014D, 1014E, and 1014F comprise at least an epitaxial growth deposition chamber and an etching chamber. In some embodiments, the integrated tool 1000 may also include an atomic layer deposition (ALD) process chamber and a physical vapor deposition (PVD) process chamber. Additional chambers may also be provided such as CVD chambers, annealing chambers, or the like. The epitaxial growth deposition chamber and the etching chamber may include any chambers suitable to perform all or portions of the methods described herein, as discussed above. In some embodiments, one or more optional service chambers (shown as 1016A and 1016B) may be coupled to the transfer chamber 1003A. The service chambers 1016A and 1016B may be configured to perform other substrate processes, such as degassing, orientation, substrate metrology, cool down and the like.

The system controller 1002 controls the operation of the tool 1000 using a direct control of the process chambers 1014A, 1014B, 1014C, 1014D, 1014E, and 1014F or alternatively, by controlling the computers (or controllers) associated with the process chambers 1014A, 1014B, 1014C, 1014D, 1014E, and 1014F and the tool 1000. In operation, the system controller 1002 enables data collection and feedback from the respective chambers and systems to optimize performance of the tool 1000. The system controller 1002 generally includes a Central Processing Unit (CPU) 1030, a memory 1034, and a support circuit 1032. The CPU 1030 may be any form of a general-purpose computer processor that can be used in an industrial setting. The support circuit 1032 is conventionally coupled to the CPU 1030 and may comprise a cache, clock circuits, input/output subsystems, power supplies, and the like. Software routines, such as a method as described above may be stored in the memory 1034 and, when executed by the CPU 1030, transform the CPU 1030 into a specific purpose computer (system controller) 1002 to perform the above-described methods. The software routines may also be stored and/or executed by a second controller (not shown) that is located remotely from the tool 1000.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof.

The invention claimed is:

1. A method for forming a sacrificial fill material, comprising:
    performing an etching process on a substrate with an opening that is conformally coated with an oxide layer, wherein the etching process is an anisotropic dry etch process using a chlorine gas to remove the oxide layer from a bottom portion of the opening while preserving the oxide layer on sidewalls of the opening, and wherein the etching process forms a partial oxide spacer in the opening and increases a depth of the opening; and
    epitaxially growing the sacrificial fill material in the opening using a bottom-up fill process by flowing a hydrogen chloride gas at a rate of approximately 60 sccm to approximately 90 sccm in a chamber pressure of approximately 1 Torr to approximately 100 Torr.

2. The method of claim 1, wherein the sacrificial fill material is silicon, silicon germanium, silicon oxide, silicon nitride, silicon carbide, aluminum oxide, or hafnium oxide.

3. The method of claim 2, wherein the silicon or the silicon germanium contains a dopant of boron, phosphorous, carbon, oxygen, or antimony.

4. The method of claim 2, wherein the sacrificial fill material is $SiGe_{0.4}$.

5. The method of claim 1, further comprising:
epitaxially growing the sacrificial fill material using a selective epitaxial growth process with a selectivity of <100> crystal plane silicon material over <110> crystal plane silicon material.

6. The method of claim 5, wherein the selectivity of <100> crystal plane silicon material over <110> crystal plane silicon material is approximately 4:1 and greater.

7. The method of claim 1 performed in an integrated cluster tool without an air break or intermediate wet preclean process.

8. The method of claim 1, wherein the rate of the hydrogen chloride gas is approximately 70 sccm.

9. The method of claim 1 performed in a process to form a backside power via for a transistor structure.

10. The method of claim 1, further comprising:
forming a self-aligned epitaxial source/drain structure of a transistor on the sacrificial fill material.

11. A method of forming a backside power rail contact for a source/drain epitaxial (Epi) structure of a transistor, comprising:
forming an opening in a substrate;
depositing a conformal layer of oxide on the substrate and in the opening;
performing an etching process on the substrate and the opening, wherein the etching process is an anisotropic dry etch process using a chlorine gas to remove the conformal layer of oxide from a bottom portion of the opening while preserving the oxide layer on sidewalls of the opening, and wherein the etching process forms a partial oxide spacer in the opening and increases a depth of the opening;
epitaxially growing a sacrificial fill material in the opening using a bottom-up fill process by flowing a hydrogen chloride gas at a rate of approximately 60 sccm to approximately 90 sccm in a chamber pressure of approximately 1 Torr to approximately 100 Torr;
forming a source/drain Epi structure on the sacrificial fill material;
forming a gate material on the source/drain Epi structure;
forming at least one interconnect signal lines above the gate material;
flipping the substrate to reveal a backside of the substrate;
removing material of the substrate to expose the sacrificial fill material;
selectively etching the sacrificial fill material to remove the sacrificial fill material; and
forming the backside power rail contact which is self-aligned to the source/drain Epi structure.

12. The method of claim 11, wherein the sacrificial fill material is silicon germanium (SiGe).

13. The method of claim 11, further comprising:
epitaxially growing the sacrificial fill material using a selective epitaxial growth process with a selectivity of <100> crystal plane silicon material over <110> crystal plane silicon material.

14. The method of claim 13, wherein the selectivity of <100> crystal plane silicon material over <110> crystal plane silicon material is approximately 4:1 and greater.

15. The method of claim 11, wherein the conformal layer of oxide is an aluminum oxide material.

16. The method of claim 11, wherein the rate of the hydrogen chloride gas is approximately 70 sccm.

17. A non-transitory, computer readable medium having instructions stored thereon that, when executed, cause a method for forming a sacrificial fill material to be performed, the method comprising:
performing an etching process on a substrate with an opening that is conformally coated with an oxide layer, wherein the etching process is an anisotropic dry etch process using a chlorine gas that removes the oxide layer from a bottom portion of the opening while preserving the oxide layer on sidewalls of the opening, and wherein the etching process forms a partial oxide spacer in the opening and increases a depth of the opening; and
epitaxially growing the sacrificial fill material in the opening using a bottom-up fill process by flowing a hydrogen chloride gas at a rate of approximately 60 sccm to approximately 90 sccm in a chamber pressure of approximately 1 Torr to approximately 100 Torr.

18. The non-transitory, computer readable medium of claim 17, the method further comprising:
epitaxially growing the sacrificial fill material using a selective epitaxial growth process with a selectivity of <100> crystal plane silicon material over <110> crystal plane silicon material and wherein the selectivity of <100> crystal plane silicon material over <110> crystal plane silicon material is approximately 4:1 and greater.

19. The non-transitory, computer readable medium of claim 17, wherein the rate of the hydrogen chloride gas is approximately 70 sccm, wherein the method is performed in an integrated cluster tool without an air break or intermediate wet preclean process, or wherein the method is performed in a process to form a backside power via for a transistor structure.

20. The non-transitory, computer readable medium of claim 17, the method further comprising:
forming a self-aligned epitaxial source/drain structure of a transistor on the sacrificial fill material.

* * * * *